(12) United States Patent
Koike

(10) Patent No.: US 6,906,648 B1
(45) Date of Patent: Jun. 14, 2005

(54) CIRCUIT AND METHOD OF MULTI-CHANNEL DUAL SLOPE ADC WITH OFFSET CANCELLATION AND HYSTERESIS INPUT

(75) Inventor: Hidcharu Koike, Yokohama (JP)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/707,666

(22) Filed: Dec. 31, 2003

(51) Int. Cl.[7] .................................................. H03M 1/10
(52) U.S. Cl. ........................................ 341/118; 341/167
(58) Field of Search ............................. 341/118, 167, 341/168

(56) References Cited

U.S. PATENT DOCUMENTS 4,337,456 A * 6/1982 Deffendall et al. ........... 341/118
5,262,780 A * 11/1993 Gray ............................. 341/166
5,321,403 A * 6/1994 Eng et al. ..................... 341/168

* cited by examiner

Primary Examiner—Howard L. Williams
(74) Attorney, Agent, or Firm—Jiang Chyun IP Office

(57) ABSTRACT

A multi-channel dual slope analog-digital converter with offset cancellation an hysteresis input is provided in the present invention, wherein a charge reset period and an auto zero period are eliminated, so as to shorten cycle time. An offset cancel capacitor is also eliminated, so that large chip area is avoided. With inserting a dummy cycle in between each measurement cycle, coupling error can be avoided between different conversion channels. Also, hysteresis property of a Schmitt comparator in the comparator unit manages to filter out minute residual voltage offset, so that the output of converter retains its residual voltage level. A multi-channel dual slope analog-digital converting method is also provided in the invention.

9 Claims, 6 Drawing Sheets

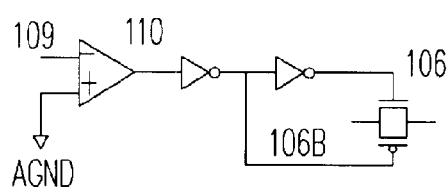
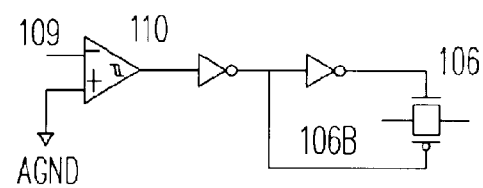
FIG. 7
FIG. 9
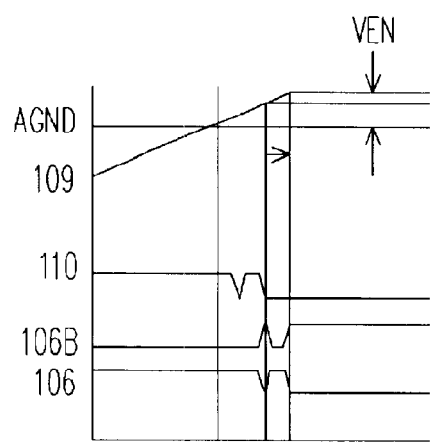
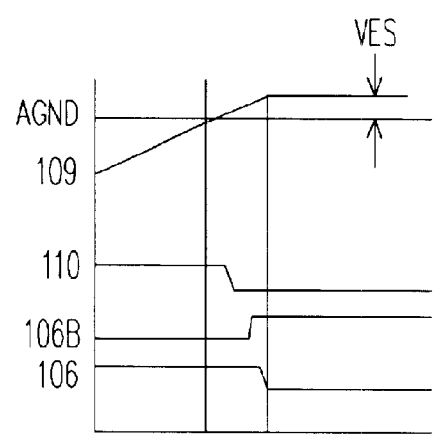
FIG. 8
FIG. 10

US 6,906,648 B1

CIRCUIT AND METHOD OF MULTI-CHANNEL DUAL SLOPE ADC WITH OFFSET CANCELLATION AND HYSTERESIS INPUT

BACKGROUND OF INVENTION

1. Field of the Invention

This invention generally relates to a multi-channel dual slope analog-to-digital converting circuit and method thereof, and more particularly to a multi-channel dual slope analog-to-digital converting circuit and method thereof having offset cancellation logic and hysteresis logic.

2. Description of Related Art

A dual slope analog-to-digital converter (ADC) having zero-reset phase is provided in a conventional scheme.

The dual slope ADC uses a correction voltage to eliminate residual offset voltage that is generated during integrating phase and discharge phase. In the conventional scheme, a comparator that is negative feedback connected manages to rapidly reset the output of an integrator, and the correction voltage is stored in the integrating capacitor and another capacitor coupling to the integrating operational amplifier. Where the devices and operation of which scheme is described as follows:FIG. 1 illustrates an offset cancellation circuit diagram of a dual slope ADC. Referring to FIG. 1 herein, the circuit configuration of initialization phase is shown. The offset voltage is stored in the capacitor 102 and all three OPAMPs are set to zero (center) position. This initialization operation is usually referred as Auto Zero operation. Whereas the drawbacks of this conventional scheme are: i. it takes substantially long time to initialize. ii. it requires a substantially large offset cancel capacitor, i.e. large chip area. iii. it has data coupling error or channel coupling error.

Since the capacitor 103 in FIG. 1 is usually a large external capacitor (e.g. >1000 pF) and the resistor 101 has a high resistance in order to generate sufficient time resolution for the dual slope ADC. In the initialization operation, the external capacitor 103 and the offset capacitor 102 are charged through the resistor 101 spontaneously, and thus causing longer initialization period. The output waveform of the integrator during the initialization period following the integrating period, the discharge period, charge reset period is depicted in the diagram of FIG. 11.

On the other hand, the capacitor 102 for the offset cancellation needs to be sufficiently large so that the stored offset voltage is not affected by input gate voltage of the OPAMPs for the integrator 202 and the comparator 203.

This means that a substantially large chip area is required for the offset capacitor 102. Referring to reset period after discharge period as well as auto-zero period shown in FIG. 11.

Moreover, when initialization is not sufficiently long, a residual charge on the external capacitor can affect conversion result to following cycles. An exemplary demonstration is shown in FIG. 11, where residual voltage depends on the initialization period, and the residual voltage affects following conversion cycles.

SUMMARY OF INVENTION

An object of the present invention is to provide a multi-channel dual slope analog-to-digital converter (ADC), where charge-reset period and auto-zero period are omitted, so that cycle length is reduced.

Another object of the present invention is to provide a multi-channel dual slope ADC, where offset cancel capacitor is omitted, so that chip area is substantially reduced.

Yet another object of the present invention is to provide a multi-channel dual slope ADC, where a dummy cycle is inserted between measurement cycles, so that to avoid coupling error between channels. This applies to single channel dual slop ADC as well.

Yet another object of the present invention is to provide a multi-channel dual slope ADC, where offset cancellation circuit eliminates residual voltage of the conversion circuit and the actual offset voltage. Thus data transmitting between chip is retained, that is process variation between chips is sufficiently small, thus fine tuning or trimming on end products is not required.

A multi-channel dual slope analog-to-digital converter (ADC) is provided in this present invention. The circuit of this present invention includes an input circuit, an integrator, a comparator, a control logic, and a data counter.

The circuit of this present invention further includes an offset cancellation logic and a hysteresis logic. The control logic determines which input voltage for the input amplifier, after the processed signal is integrated, the comparator comes into play. The offset cancellation logic couples to the data counter, which is controlled by the control logic. Whereas the hysteresis logic is coupled to the offset cancellation logic. On the other hand, the control logic selects one of the input voltage levels, in order to process various cycles.

The circuit of the present invention does not have the auto zero operation before each measurement cycle, instead, requires one initialization cycle and one offset cancellation cycle before following consecutive measurement cycles. Where each cycle is comprised of an integrating period and a discharge period. In the initialization cycle and the offset cancellation cycle, a first reference voltage is selected as the input voltage in the integrating period whereas a second reference voltage is selected in discharge period. In the beginning of initialization cycle, the residual voltage on the integrating capacitor is unknown, yet the residual voltage at the end of the initialization cycle is determined by the offset voltage and delay time of the comparator, and delay time of the control logic circuit. The residual voltage is hence kept constant in the following consecutive cycles.

The aforementioned input circuit includes an input amplifier that is connected in voltage follower fashion and switches for selecting input voltages controlled by the control logic. The integrator is connected in a negative feedback loop fashion including a capacitor and a resister, where the positive input terminal is coupled to analog ground. Between the input amplifier and the integrator, a switch is disposed, which is controlled by the control logic as well. The offset-cancellation logic includes a constant register, an offset register coupling to the constant register, and a first subtractor coupling to the data counter and the offset register, yet feed back connected to offset register. Furthermore, the hysteresis logic includes at least two data registers and a second subtractor. One of the data registers is coupled to the other data register, which is coupled to the second subtractor. The subtractor is coupled to the first subtractor, while the two data registers and the second subtractor are connected in feedback fashion. The data from the first subtractor is coupled to both data registers.

According to the multi-channel dual slope analog-to-digital converter in the present invention, the first reference voltage is converted to a digital value and saved in a data counter during the offset cancellation cycle. The difference between the converted data and the correct digital value of the first reference voltage which is stored in a constant register is calculated by a subtractor and saved in an offset register.

The circuit provided in this present invention applies to multi-channel converter, whereas a double-channel converter is described as an example in this specification of the present invention.

In the first measurement cycle, a first input signal of a first channel is selected as the input voltage in the integrating period. The converted data is saved in the data counter. The offset data stored in the offset register is subtracted from the converted data to get the new data of the first channel.

The new data is compared with the previous data of the first channel stored in a first data register. If the difference between the new data and the previous data is bigger than a predetermined value, the new data is stored in the first data register and the output data of the first channel is updated.

In the second measurement cycle, a second input signal of a second channel is selected as the input voltage in the integrating period. The converted data is saved in the data counter. The offset data stored in the offset register is subtracted from the converted data to get the new data of the second channel.

In this present invention, it is noted that the first input signal, the second input signal and the first reference voltage are higher than an analog ground voltage, and the second reference voltage is lower than the analog ground voltage. Thus the residual voltage is retained at a constant value after measurement cycles begin according to the present invention.

In order to eliminate channel coupling error, a hysteresis logic is provided to the multi-channel dual slope analog-to-digital converter in this present invention. An example of double-channel is described herein. In ordinary, the input voltage of the first channel and the second channel are measured alternatively. If the input voltage of the second channel is constant as the input voltage of the first channel changes, and the residual voltage at the end of the cycle depends on the input voltage of the cycle, the conversion results of the second channel are affected by the input voltage of the first channel of the previous cycle. Even if the change of the residual voltage is minor, it is expected that the conversion result is affected by the input voltage of the previous cycle, especially when the input voltage of the second channel is on code boundary. In order to avoid the situation, a hysteresis logic is provided in the present invention that keeps the conversion result unchanged unless the difference between the new data and the old data is larger than a predetermined value that is expected to be minimal. As the present invention eliminates the auto zero operation, the residual voltage does not follow the input voltage ideally. However there are other factors that affect the residual voltage, such as leakage current of the external capacitor and unstable operation of the comparator caused by noise. To avoid foregoing and unexpected problems, the present invention applies the hysteresis logic to filter out minor deviation of the residual voltage.

To avoid channel coupling error by the minor deviation of the residual voltage, the present invention introduces following methods as examples. First is to insert dummy cycles between measurement cycles, and another is to replace the comparator with a Schmitt comparator. The purposed methods are described hereafter.

A first method to eliminate deviation of the residual voltage is to insert a dummy cycle before each measurement cycle. According to this method, it is expected that the conversion result of a measurement cycle be not affected by the previous measurement cycle. This method also applies to single input dual slope ADC. By inserting a dummy cycle before each measurement cycle, as the residual voltage at the end of each dummy cycle is to be the same, the conversion result of each measurement cycle is hence not affected by the input data of the previous measurement cycle.

Another method to eliminate channel coupling error is to provide a Schmitt comparator. The Schmitt comparator manages to provide hysteresis for the input voltage, where noise that occurs from input or power line is stabilized out, meaning the control circuit with Schmitt comparator keeps residual voltage stable.

The above is a brief description of some deficiencies in the prior art and advantages of the present invention.

Other features, advantages and embodiments of the invention will be apparent to those skilled in the art from the following description, accompanying drawings and appended claims.

BRIEF DESCRIPTION OF DRAWINGS

FIG. 7 is a control circuit diagram illustrating the multi-channel dual slope ADC with offset cancellation and hysteresis input using a normal comparator according to a preferred embodiment of the present invention.

FIG. 8 is a diagram illustrating waveforms of the multi-channel dual slope ADC with offset cancellation and hysteresis input using a normal comparator according to a preferred embodiment of the present invention.

FIG. 9 is a control circuit diagram illustrating the multi-channel dual slope ADC with offset cancellation and hysteresis input using Schmitt comparator according to a preferred embodiment of the present invention.

FIG. 10 is a diagram illustrating waveforms of the multi-channel dual slope ADC with offset cancellation and hysteresis input using Schmitt comparator according to a preferred embodiment of the present invention.

DETAILED DESCRIPTION

Figure 1:
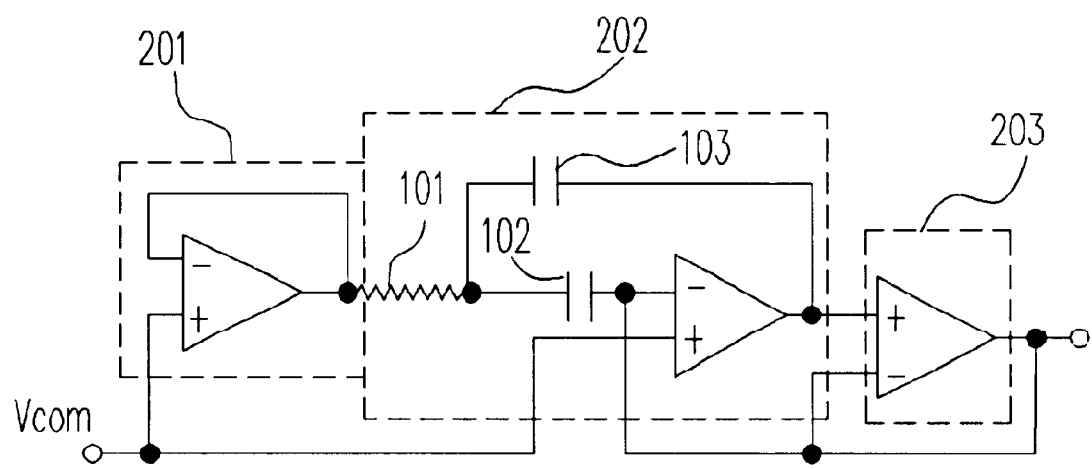
FIG. 1 is a circuit diagram illustrating an offset cancellation circuit for a dual slope analog-to-digital converter (ADC) according to a conventional scheme.
Figure 2:
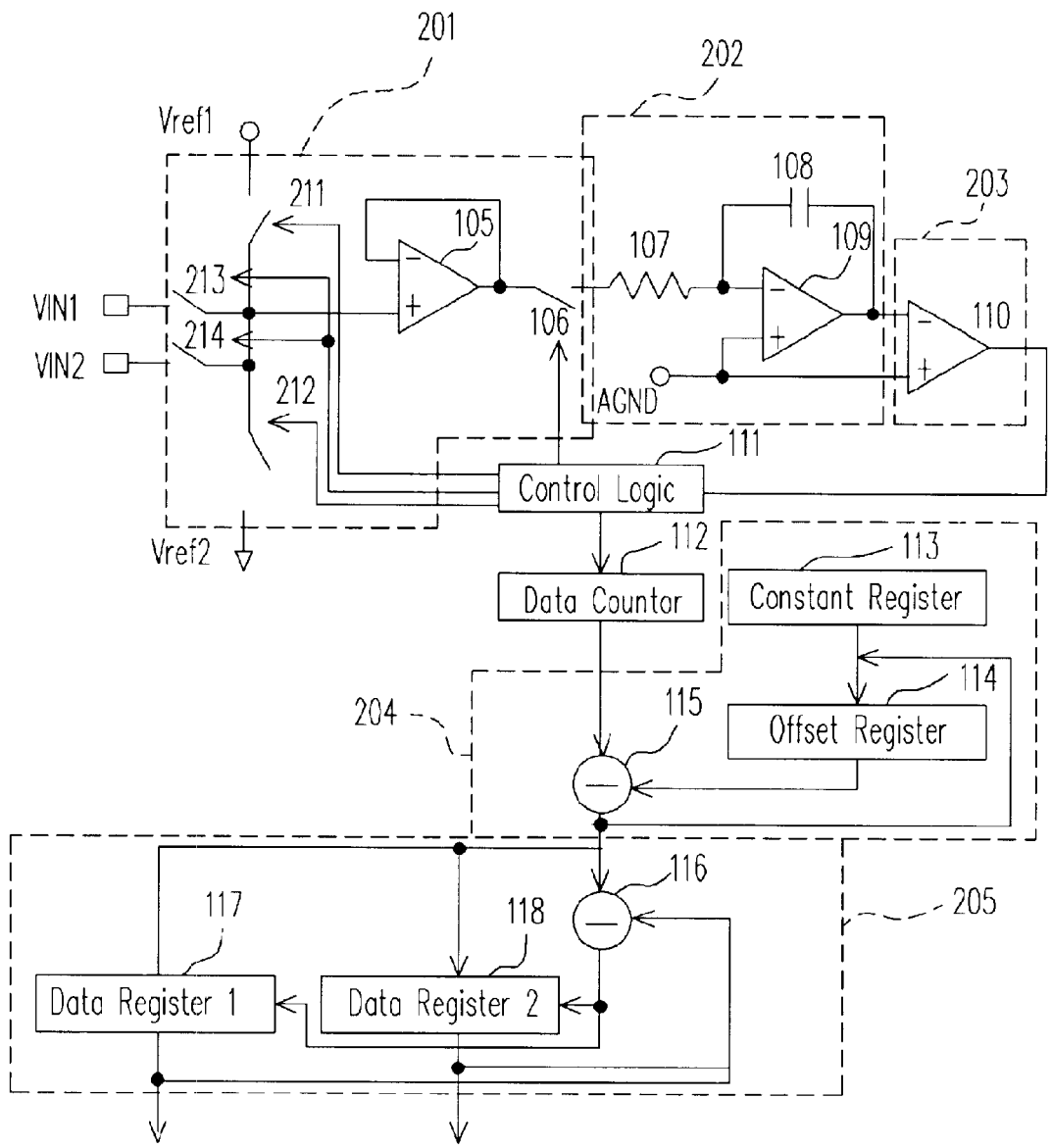
FIG. 2 is a circuit diagram illustrating a dual channel dual slope ADC with offset cancellation and hysteresis input according to a preferred embodiment of the present invention.

Referring to FIG. 2, it is a circuit diagram illustrating a dual slope analog-to-digital converter (ADC) according to one preferred embodiment of the present invention. A multi-channel dual slope analog-to-digital converter (ADC) is provided in this present invention. The circuit of this present invention includes an input circuit 201, an integrator 202, a comparator 203, a control logic 111, and a data counter 112. The circuit of this present invention further includes an offset cancellation logic 204 and a hysteresis logic 205. The control logic 111 determines input voltage for the input amplifier 105, after the processed signal is integrated, the comparator 203 comes into play. The offset cancellation logic 204 couples to the data counter 112, which is controlled by the control logic 111. Whereas the hysteresis logic 205 is coupled to the offset cancellation logic 204. On the other hand, the control logic 111 selects one of the input voltage levels, in order to process various cycles.

Figure 3:
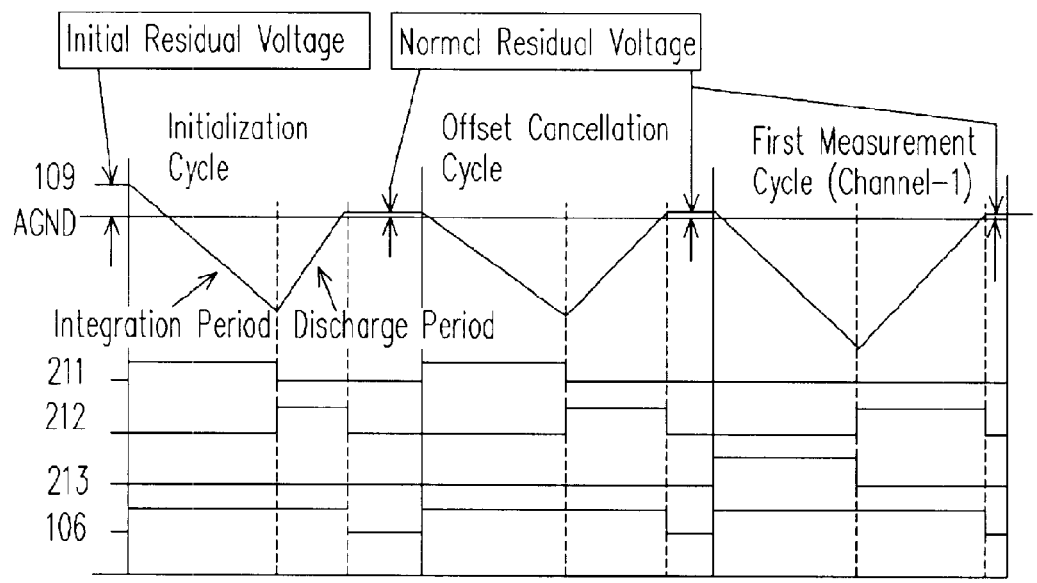
FIG. 3 is a diagram illustrating output waveform of integrator OPAMP109 of the multi-channel dual slope ADC with offset cancellation and hysteresis input according to a preferred embodiment of the present invention.

The circuit of the present invention does not have the auto zero operation before each measurement cycle, instead, requires one initialization cycle and one offset cancellation cycle before following consecutive measurement cycles as shown in FIGS. 3 to 6, and will be described hereafter. As shown in FIG. 3, each cycle is comprised of an integrating period and a discharge period. In the initialization cycle and the offset cancellation cycle, a first reference voltage Vref1 is selected as the input voltage in the integrating period whereas a second reference voltage Vref2 is selected in discharge period. In the beginning of initialization cycle, the residual voltage on the integrating capacitor 108, yet the residual voltage at the end of the initialization cycle is determined by the offset voltage and delay time of the comparator 203, and delay time of the control logic circuit 111 as depicted in FIG. 2. The residual voltage is hence kept constant in the following consecutive cycles.

Referring to FIG. 2, the aforementioned input circuit 201 includes an input amplifier 105 that is connected in voltage follower fashion and switches for selecting input voltages controlled by the control logic. The integrator 109 is connected in a negative feedback loop fashion including a capacitor 108 and a resister 107, where the positive input terminal is coupled to analog ground. Between the input amplifier 105 and the integrator 109, a switch 106 is disposed, which is controlled by the control logic 111 as well. The offset-cancellation logic 204 includes a constant register 113, an offset register 114 coupling to the constant register 113, and a first subtractor 115 coupling to the data counter 112 and the offset register 114, yet feed back connected to offset register 114. Furthermore, the hysteresis logic 205 includes at least two data registers 117 and 118, and a second subtractor 116. One of the data registers is coupled to the other data register, which is coupled to the second subtractor 116. The second subtractor 116 is coupled to the first subtractor 115, while the two data registers 117 and 118, and the second subtractor 116 are connected in feedback fashion. The data from the first subtractor 115 is coupled to both the data registers 117 and 118.

The circuit of the present invention eliminates the auto zero operation before each measurement cycle, whereas one initialization cycle and one offset cancellation cycle are introduced before following consecutive measurement cycles. In the initialization cycle and the offset cancellation cycle, a first reference voltage Vref1 is selected as the input voltage in the integrating period. A second reference voltage Vref2 is always selected in the discharge period. In the beginning of initialization cycle, the residual voltage in the integrating capacitor 108 is unknown, but the residual voltage at the end of the initialization cycle is determined by the offset voltage, the delay time of the comparator, and the delay time of the control logic circuit 111. The residual voltage is thus kept constant in the following consecutive cycles.

On the other hand, in the offset cancellation cycle, the first reference voltage Vref1 is converted to a digital value and is saved in the data counter 112. The difference between the converted data and the correct digital value of Vref1 which is stored in the constant register 113 is calculated by a subtractor 115 and saved in an offset register 114.

In the first measurement cycle, a first input voltage VIN1 of the first channel channel-1 is selected as the input voltage in the integrating period. The converted data is saved in the data counter 112. The offset data stored in the offset register 114 is subtracted from the converted data to get the new data of channel-1.

Thereafter, the new data is compared with the previous data of channel-1 that is stored in a first data register 117.

If the difference between the new data and the previous data is larger than a predetermined minimum value, the new data is stored in the first data register and the output data of channel-1 is updated.

In the second measurement cycle, a second input voltage VIN2 of a second channel channel-2 is selected as the input voltage in the integrating period. The converted data is saved in the data counter 112. The offset data stored in the offset register 114 is subtracted from the converted data to get the new data of channel-2.

The new data is compared with the previous data of channel-2 stored in the second data register 118. If the difference between the new data and the previous data is larger than the predetermined minimum value, the new data is stored in the second data register and the output data of channel-2 is updated.

In this present invention, it is noted that the first input signal VIN1, the second input signal VIN2 and the first reference voltage Vref1 are higher than an analog ground voltage AGND, and the second reference voltage Vref2 is lower than the analog ground voltage AGND. Referring to FIG. 3, the residual voltage after initialization and offset cancellation cycles is constant as illustrated according to the output waveform of integrator OPAMP109 in the multi-channel dual slope ADC according to the present invention.

Figure 4:
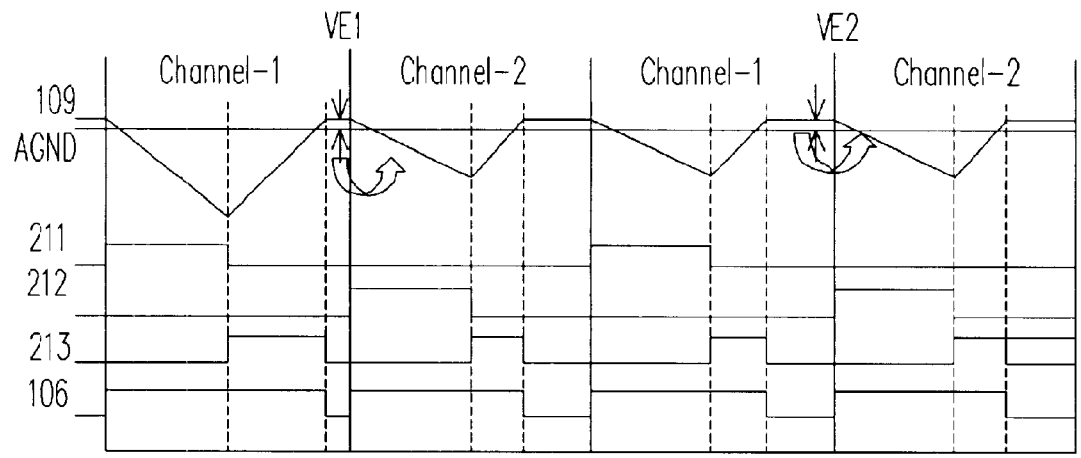
FIG. 4 is a diagram illustrating output waveforms of OPAMP 109 during the measurement cycle of the multi-channel dual slope ADC with offset cancellation and hysteresis input according to a preferred embodiment of the present invention.

Referring to HG. 4, a channel coupling error between the first and the second channel is described herein. The input voltage of channel-1 and channel-2 are measured alternatively as shown in the waveforms of FIG. 4. If the input voltage of channel-2 is constant while the input voltage of channel-1 changes, and if the residual voltage at the end of the cycle (VE1 and VE2, as shown in the figure) depends on the input voltage of the cycle, the conversion results of channel-2 are affected by the input voltage of channel-1 of the previous cycle. Even if the change of the residual voltage is substantially small, it is expected that the conversion result is affected by the input voltage of the previous cycle, especially when the input voltage of channel-2 is on a code boundary.

To avoid channel coupling error by the minor deviation of the residual voltage, the present invention introduces following methods as examples. First is to insert dummy cycles between measurement cycles, and another is to replace the comparator with a Schmitt comparator. The purposed methods are described hereafter, where in the method of dummy cycle is shown in FIGS. 5 and 6, and the method using Schmitt comparator is shown in FIGS. 7 to 10.

Figure 5:
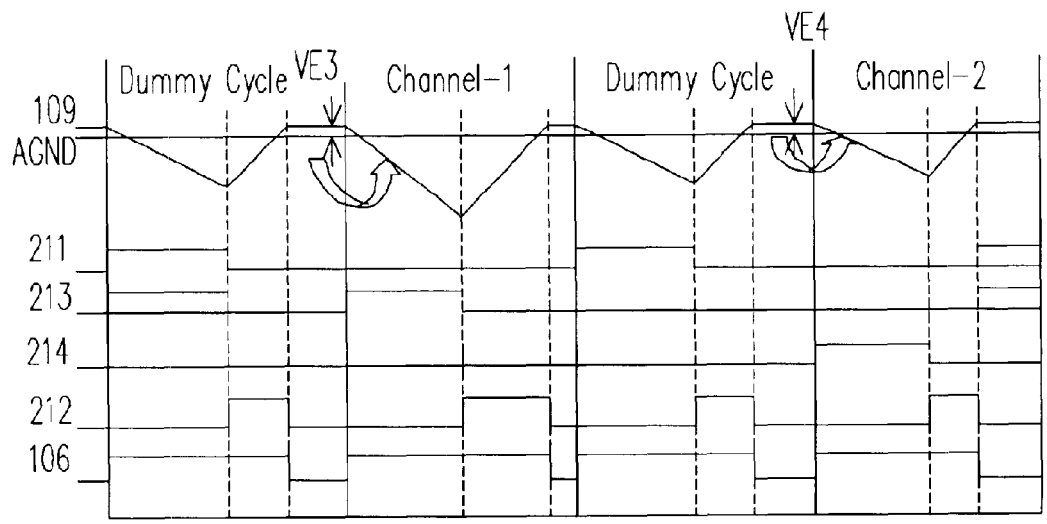
FIG. 5 is a diagram illustrating dummy cycle waveforms of the multi-channel dual slope ADC with offset cancellation and hysteresis input according to a preferred embodiment of the present invention.
Figure 6:
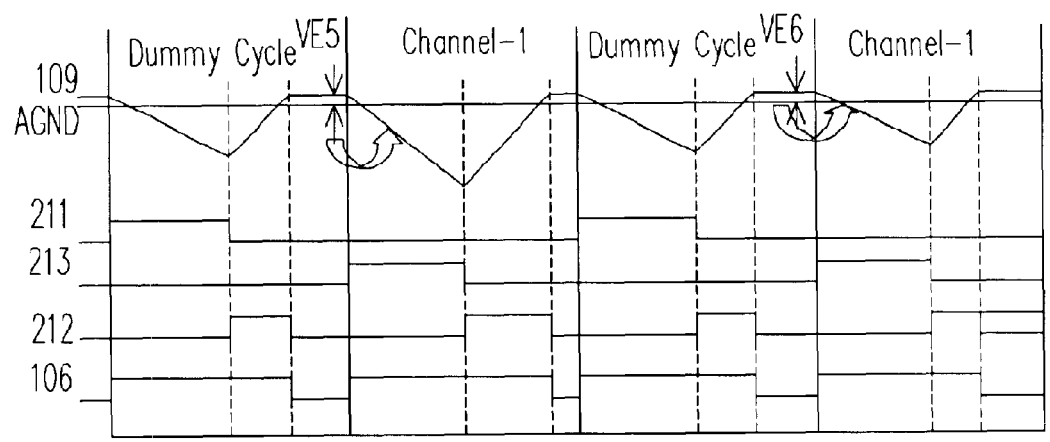
FIG. 6 is a diagram illustrating a dummy cycle waveform of the single channel dual slope ADC with offset cancellation and hysteresis input according to a preferred embodiment of the present invention.
Figure 11:
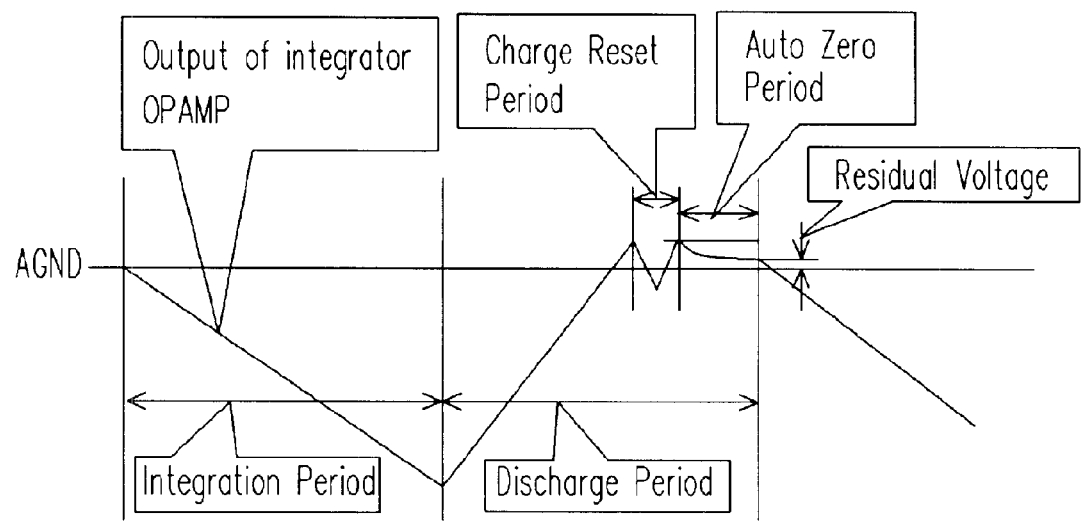
FIG. 11 is a diagram illustrating output waveforms of the integrator of the during integration, discharge, charge-reset and auto-zero period of the dual slope analog-to-digital ADC according to a conventional scheme.

Referring to FIG. 5, one preferred embodiment of the present invention is illustrated therein. Inserting a dummy cycle before each measurement cycle, it is expected that the residual voltage at the end of each dummy cycle is the same (VE3 equal to VE4, as shown in the figure). Thus it is expected that the conversion result of a measurement cycle be not affected by the previous measurement cycle. This method also applies to single input dual slope ADC. By inserting a dummy cycle before each measurement cycle, as the residual voltage at the end of each dummy cycle is to be the same (VE5 equals to VE6, as shown in the figure), the conversion result of reach measurement cycle is not affected by the input data of the previous measurement cycle as shown in FIG. 6.

Referring to FIG. 7, partial circuit of the dual slope ADC of FIG. 2 is illustrated herein. The input signal 109 to a comparator 110 crosses the AGND as shown in FIG. 8. When the input signal 109 goes higher than AGND, the output of the comparator changes from "high" to "low" level. And this change propagates to analog switch through inverters. The timing to turn off the analog switch, however, is affected by noise of the input signal and/or power lines, because the comparator becomes unstable when the input signal across the threshold voltage of the comparator. The timing shift affects the residual voltage VEN at the end of the cycle.

Referring to FIG. 9, a dual slope ADC with Schmitt comparator is illustrated herein. The Schmitt comparator provides hysteresis to the input voltage for stabilizing out the noise from the input and/or power lines. The control circuit with Schmitt comparator keeps the residual voltage stable.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A dual slope: analog-to-digital converter, comprising:
   an input circuit;
   an integrator;
   a comparator;
   an offset cancellation logic;
   a hysteresis logic;
   a control logic; and
   a data counter,
   wherein the input circuit selectively supplies a plurality of input voltages and a plurality of reference voltages to the integrator, the control logic determines a first reference voltage for providing for the input circuit during initialization, being integrated by the integrator, a residual voltage is determined as a second reference voltage is provided during discharge period, the data counter converts an input voltage to a digital data corresponding to the discharge period, the offset cancellation logic determines an offset value from the first reference voltage during an offset cancellation cycle and compares which with input value that is to be converted, the hysteresis logic updates the output value comparing a newly converted value during the current measurement cycle and a previous value converted in a previous measurement cycle.

2. The dual slope analog-to-digital converter as recited in claim 1, wherein the hysteresis logic comprises:
   at least a first data register, for storing the first input voltage in digital form; and
   a subtractor, the subtractor calculates the difference between a newly converted value during the current measurement cycle and the previous value converted in the previous measurement cycle and stored in the data register, the hysteresis logic updates the register with the newly converted value if the difference is bigger than a predetermined value.

3. The dual slope analog-to-digital converter as recited in claim 1, wherein the control logic determines input signal to the first operational amplifier to be the first reference voltage, the second reference voltage, and at least one of a first input voltages, and at least controls a switch between the input amplifier and the integrator, the control logic comprises:
   a first inverter, for inverting output signal of the comparator; and
   a second inverter, coupling across the switch, for inverting output signal of the first inverter.

4. A dual slope analog-to-digital converting method, comprising a plurality of cycles, each one of the cycles comprises an integrating period, a discharge period, the dual slope analog-to-digital converting method comprises:
   performing an initialization cycle;
   performed an offset cancellation cycle;
   performing a first measurement cycle, for providing a first channel for converting a first input voltage, wherein the initialization cycle, the offset cancellation cycle, and the fit measurement cycle are performed in a sequence as cited;
   providing a first reference voltage during the integrating period of the initialization cycle, providing a second reference voltage during the discharge period of the initialization cycle for generating a residual voltage;
   converting the first reference voltage into digital form and saving which in a constant register during the offset cancellation cycle;
   operating with the first subtractor on the first reference voltage in digital form and the value stored in the constant data register to obtain difference to be saved in an offset register;
   providing the first input voltage during the integrating period of the first measurement cycle, providing a second reference voltage during the discharge period of the first measurement period, converting the first input voltage into digital form and saving which to the data counter during the first measurement cycle, and from which subtracting the value saved in the offset register to obtain a new first channel value; and
   comparing the new first channel value with the first channel value saved in a data register, if differing larger than a first minimum, the new first channel value takes place in the first data register, and output of the first channel is updated.

5. The dual slope analog-to-digital converting method as recited in claim 4, wherein the first input voltage, the first reference voltage are higher than an analog ground voltage level, and the second reference voltage is lower than the analog ground voltage level.

6. The dual slope analog-to-digital converting method as recited in claim 5, wherein a dummy cycle is inserted before each the first measurement cycle, and providing the first reference voltage during the integrating period, providing the second reference voltage during the discharge period.

7. A dual slope analog-to-digital converting method, comprising a plurality of cycles, each one of the cycles comprises an integrating period, a discharge period, the dual slope analog-to-digital converting method comprises:

performing an initialization cycle;

performing an offset cancellation cycle;

performing a first measurement cycle, for providing a first channel for converting a first input voltage, providing a first reference voltage during the integrating period of the initialization cycle, providing a second reference voltage during the discharge period of the initialization cycle for generating a residual voltage;

converting the first reference voltage into digital form and saving which in a constant register during the offset cancellation cycle;

operating with the first subtactor on the first reference voltage in digital form and the first reference value in digital form stored in the constant register to obtain difference to be saved in an offset register;

providing the first input voltage during the integration period of the first measurement cycle, providing the second reference voltage during the discharge period of the first measurement cycle, converting the first input voltage into digital form and saving which to the data counter during the first measurement cycle, and from which subtracting the value saved in the offset register to obtain a new first channel value;

comparing the new first channel value with the first channel value saved in a first data register, if differing larger than a first minimum, the new first channel value takes place in the first data register, and output of the first channel is updated;

providing the second input voltage during the integrating period of the second measurement cycle, providing the second reference voltage during the discharge period of the second measurement cycle, converting the second input voltage into digital form and saving which to the data counter during the second measurement cycle, and from which subtracting the value saved in the offset register to obtain a new second channel value; and comparing the new second channel value with the second channel value saved in a second data register, if differing larger than the first minimum, the new second channel value takes place in the second data register, and output of the second channel is updated.

8. The dual slope analog-to-digital converting method as recited in claim 7, wherein the first input voltage, the first reference voltage are higher than a ground voltage level, and the second reference voltage is lower than the ground voltage level.

9. The dual slope analog-to-digital converting method as recited in claim 8, wherein a dummy cycle is inserted before the first measurement cycle and the second measurement value, the dummy cycle comprises providing the first reference voltage during the integrating period, and providing the second reference voltage during the discharge period.

* * * * *